United States Patent [19]
McBride et al.

[11] Patent Number: 5,661,427
[45] Date of Patent: *Aug. 26, 1997

[54] SERIES TERMINATED CLOCK DESKEWING APPARATUS

[75] Inventors: Ken McBride, Sunnyvale; Cecil Aswell, Orangevale, both of Calif.

[73] Assignee: Micro Linear Corporation, San Jose, Calif.

[*] Notice: The term of this patent shall not extend beyond the expiration date of Pat. No. 5,594,376.

[21] Appl. No.: 317,675

[22] Filed: Oct. 5, 1994

[51] Int. Cl.⁶ .............................. H03K 5/13; G01R 25/04
[52] U.S. Cl. .......................... 327/236; 327/146; 327/149; 327/161
[58] Field of Search .................. 327/141, 144–153, 327/155–163, 231, 233–237, 243–245, 248–252, 292

[56] References Cited

U.S. PATENT DOCUMENTS

| | | | |
|---|---|---|---|
| 4,922,141 | 5/1990 | Lofgren et al. | 307/595 |
| 5,101,117 | 3/1992 | Johnson et al. | 307/269 |
| 5,122,679 | 6/1992 | Ishii et al. | 307/269 |
| 5,274,677 | 12/1993 | Ohuchi et al. | 375/107 |
| 5,295,164 | 3/1994 | Yamamura | 375/120 |
| 5,298,866 | 3/1994 | Kaplinski | 328/155 |
| 5,361,277 | 11/1994 | Grover | 375/107 |

*Primary Examiner*—Timothy P. Callahan
*Assistant Examiner*—T. Lam
*Attorney, Agent, or Firm*—Haverstock & Associates

[57] ABSTRACT

A series clock deskewing apparatus uses a series terminated single transmission line system to deliver a clock signal to a load. A plurality of series clock deskewing apparatuses are implemented, one for each load, so that the clock signal is delivered to all loads simultaneously. Each series clock deskewing apparatus has a single series termination resistor with the same impedance value as the transmission line to which it is coupled. For each load, the clock signal travels the transmission line from a clock generator to the load and is simultaneously applied to the deskewing apparatus. A clock signal is reflected at the load back to the deskewing apparatus. The roundtrip transit time is determined by the deskewing apparatus which causes an appropriate delay to adjust each clock signal to arrive synchronously at all the loads. A programmable output driver impedance network can be used for the single line termination resistor of the series terminated clock deskewing apparatus can be used with transmission lines having different line impedances.

19 Claims, 5 Drawing Sheets

SERIES TERMINATED CLOCK DESKEWING APPARATUS

FIELD OF THE INVENTION

This invention relates to the field of integrated circuit clock generators. More specifically, this invention relates to the field of integrated circuit clock generators which deliver the clock signal to all loads at essentially the same time.

BACKGROUND OF THE INVENTION

For proper operation of certain types of systems, it is important that all the loads on the board receive the clock signal at essentially the same time often such systems are manufactured using integrated circuit chips on a printed circuit board. Because the distance from the clock generating circuit to the different chips is not the same, unless a clock synchronizing technique is used, the loads will receive the clock signal at different times. Various techniques have been used in the prior art to synchronize the clock signal so that it is received by all the loads at the same time. These prior art techniques include designing the printed circuit board so that all the lines between the clock signal and the loads are the same length. In order to achieve synchronization, some of the lines carrying the clock signal may have complex serpentine paths to achieve a longer delay. Another technique uses a clock generator with programmable clock edges. Both of these well known techniques require knowledge about the physical construction of the printed circuit board beforehand and require the system designer to calculate differences in transit times for the clock signals.

A clock generator circuit taught in U.S. Pat. No. 5,298,866 is illustrated in FIG. 1. A clock input signal line 1 is coupled to a first end of a maximum delay line 2. A second end of the maximum delay line 2 is coupled to a phase detector 3 for comparing the timing between two signals. This phase detector is similar to a phase-frequency detector as used in phase-locked-loops. An output of the phase detector 3 is coupled to a low-pass filter 4 for filtering the output of the phase detector. The variable delay lines 5 and 6 are matched so that they have equal delays. Both variable delay lines 5 and 6 are coupled to and controlled by the output of the low-pass filter 4. The maximum delay of the variable delay lines 5 and 6 is equal to half of the delay of the maximum delay line 2. The variable delay lines 5 and 6 will typically be implemented as voltage controlled delay lines.

An output of the variable delay line 5 is coupled as the other input to the phase detector 3. The clock input signal line 1 is coupled as the input of the variable delay line 6. The output of the variable delay line 6 is coupled to an input of an output buffer 7. The output buffer 7 is typically implemented as a TTL or CMOS low impedance driver. An output of the output buffer 7 is coupled by a drive transmission line 11 to a load 9. A sense transmission line 10 is also coupled to the load 9 and to an input of an input buffer 8. An output of the input buffer 8 is coupled as the input to a variable delay line 5. The input buffer 8 can be implemented as a typical TTL or CMOS input gate. The resistors R1 and R2 are termination resistors used to prevent reflections on the transmission lines, and are normally external to the integrated circuit because of their power dissipation. The drive 11 and sense 10 transmission lines are required to have equal propagation delays, achieved by matching the length of these lines. To ensure this, the lines are formed parallel to one another on the printed circuit board so that they essentially have identical paths.

The clock input signal line 1 is applied to a plurality of identical clock driver sections, each driving a different load 9 with a different external propagation delay along drive and sense transmission lines 11 and 10. Within each clock driver section, the clock input signal line 1 is applied to a fixed maximum delay line 2 and a variable delay line 6. The output of the variable delay line 6 is buffered by the output buffer 7 and applied to the drive transmission line 11 and then to the load 9. The drive transmission line 11 has a propagation time delay $t_d$. This signal then returns to the clock driver section through the sense transmission line 10. The sense transmission line 10 also has a propagation time delay $t_d$, which makes the roundtrip delay from the clock driver section to the load 9 and back again, a time of $2t_d$. The sense transmission line 10 is terminated at the sense point 14 between the two resistors R1 and R2.

The sense point 14 is coupled to the input of the input buffer 8. The output of the input buffer 8 is applied to the variable delay line 5. The other end of the variable delay line 5 is input into the phase detector 3 where it is compared with the output of the maximum delay line 2. The output of the phase detector 3 is then filtered by the low-pass filter 4 and applied to control the variable delay lines 5 and 6 with the control signal line 12. The control signal line 12 is used to vary the delay of the variable delays 5 and 6 such that the inputs to the phase detector 3 arrive simultaneously. The phase detector 3, low pass filter 4 and the voltage controlled variable delay lines 5 and 6 form a Delay Locked Loop.

If the loop gain is sufficient, the delay from the clock input signal 1 through the variable delay line 6, the output buffer 7, the drive transmission line 11, the sense transmission line 10, the input buffer 8 and the variable delay line 5 will be driven by the closed loop, to be equivalent to the delay through the maximum delay line 2. The sufficient gain needed for this delay can be achieved by using an integrator in the low pass filter 4. Any variation in the propagation time delay $t_d$ will automatically be compensated for by the closed loop so that the total delay from the clock input signal 1 to the output 13 of the variable delay line 5 will always be the same, as long as the required delay correction does not exceed the limits of the ranges of the variable delay lines 5 and 6. This relationship can be expressed by the following equation:

$$\text{Delay}(A)=\text{Delay}(E)+\text{Delay}(G)+\text{Delay}(F)+\text{Delay}(D)+2t_d. \quad (1)$$

Since the variable delay lines 5 and 6 are identical, $$\text{Delay}(E)=\text{Delay}(D). \quad (2)$$

The delays through the maximum delay line 2, the output buffer 7 and the input buffer 8 are all constants. Equation (1) can then be rewritten as $$t_d+\text{Delay}(E)=[\text{Delay}(A)-\text{Delay}(F)-\text{Delay}(G)]/2 \quad (3)$$

or $$t_d+\text{Delay}(E)=\text{constant}. \quad (4)$$

If the same clock input signal 1 is applied to a number of identical deskew elements driving loads at different distances, with different transmission line delays, $t_d$. Equation (4) shows that the clock edge will arrive at all loads driven by the different deskew elements at the same time, assuming that the constant is the same for all of the deskew elements in the circuit. As can be seen, the time delay $t_d$ for the longest correctable load will be equal to the constant, with the variable delay time Delay(E) for this load set at zero. For those loads whose time delay $t_d$ is not as long the constant, then the difference will be made up by adjusting the variable delay time Delay(E) for that load, so that all loads will receive the clock signal input simultaneously. Thus, the delay time Delay(E) through the variable delay lines 5 and 6 for each load will equal the time delay $t_d$ for the load with the longest transmission lines minus the time delay $t_d$ for the specific load or $$Delay(E)=constant-t_d \qquad (5)$$

The external transmission line section of FIG. 1 is illustrated in FIG. 2. This external transmission line section requires two transmission line segments 10 and 11, one for driving the load 9 and one for sensing the round trip delay from the load 9. The two transmission line segments 10 and 11 can be considered a single tapped transmission line with a tap in the middle to accommodate the load 9.

To prevent reflections from occurring along the transmission line, a resistive termination is included at the sense end 14 of the transmission line. This resistive termination at the output is comprised of the network including the two resistors R1 and R2. The node between the two resistors is the sense node 14 as discussed above. If the transmission line is not properly terminated, reflections from the sense node 14 of the line will be reflected back towards the load 9 and cause undesirable distortion or ringing to appear at the load 9. Were such reflections to reach the output buffer 7 or driver they would be again reflected, further compounding the problem.

The transmission lines 10 and 11 each have a characteristic impedance which is equivalent and designated as $Z_o$. This characteristic impedance will typically have a value of 50 ohms, but can also have other impedance values depending on the transmission lines. The termination network comprising the resistors R1 and R2 is resistive in nature and has an equivalent Thévenin value equal to the characteristic impedance $Z_o$ of the transmission line. This type of termination is commonly known as Thévenin termination. It will be apparent to one of ordinary skill in the art that a purely resistive Thévenin termination network can have significant static power dissipation for TTL and CMOS levels.

In reality, no load will have a negligible impedance. A typical load used in common circuitry is a CMOS input buffer which is primarily capacitive and in the range of 5 to 20 picofarads. Capacitors of this size on a tapped delay line will cause reflections of the drive signal which will be reflected back towards the driver or output buffer 7. This reflection will be reflected back by the driver 7 and cause distortion at the load 9 which can be significant with fast rise and fall time signals. Compromise termination and the use of non-linear, TTL type, drivers can help this problem, but will not eliminate it.

What is needed is an apparatus for deskewing clocks without requiring the system designer to calculate transit times along transmission lines or the overhead associated with parallel traces. Further what is needed is a way to terminate the transmission line without the significant static power dissipation of a parallel termination. What is also needed is a way to eliminate the reflection and re-reflection on the transmission line which causes distortion at the load 9.

SUMMARY OF THE INVENTION

A series clock deskewing apparatus uses a series terminated transmission line system to deliver a clock signal to a load. A plurality of series clock deskewing apparatuses are implemented, one for each load, so that the clock signal is delivered to all loads simultaneously. Each series clock deskewing apparatus has a single series termination resistor with the same impedance value as the transmission line to which it is coupled. The single termination resistor is usually left external to the integrated circuit, to provide flexibility when selecting the impedance of the transmission line. For each load, the clock signal travels the transmission line from a clock generator to the load and is simultaneously applied to the deskewing apparatus. A clock signal is reflected at the load back to the deskewing apparatus. The roundtrip transit time is determined by the deskewing apparatus which causes an appropriate delay to adjust each clock signal to arrive synchronously at all the loads. A programmable output driver impedance network internal to the integrated circuit can be used instead of the single external termination resistor of the series terminated clock deskewing transmission line system. This can provide flexibility so that different line impedances can be accommodated without requiring a termination resistor external to the integrated circuit.

DETAILED DESCRIPTION OF THE PREFERRED EMBODIMENT

Figure 2:
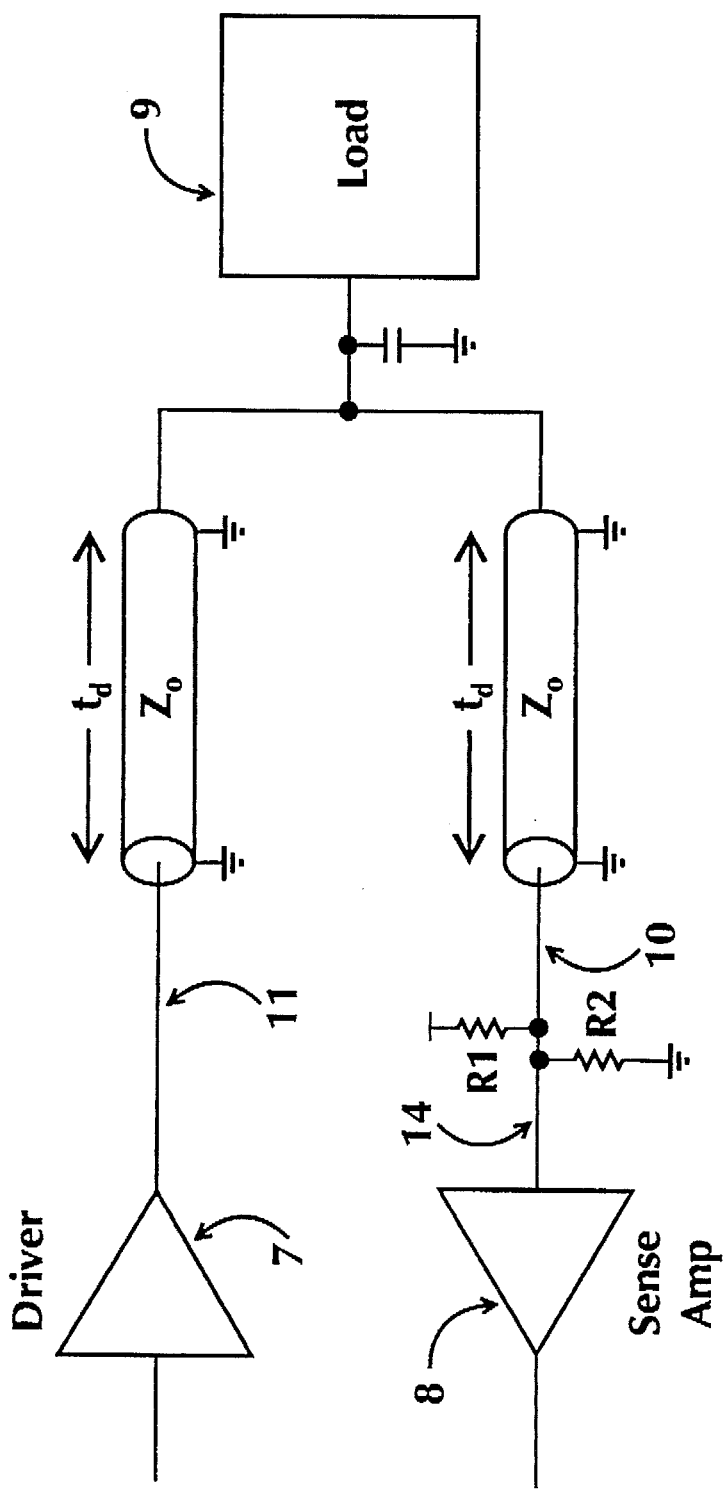
FIG. 2 illustrates the prior art Thévenin terminated transmission line network of FIG. 1.
Figure 3:
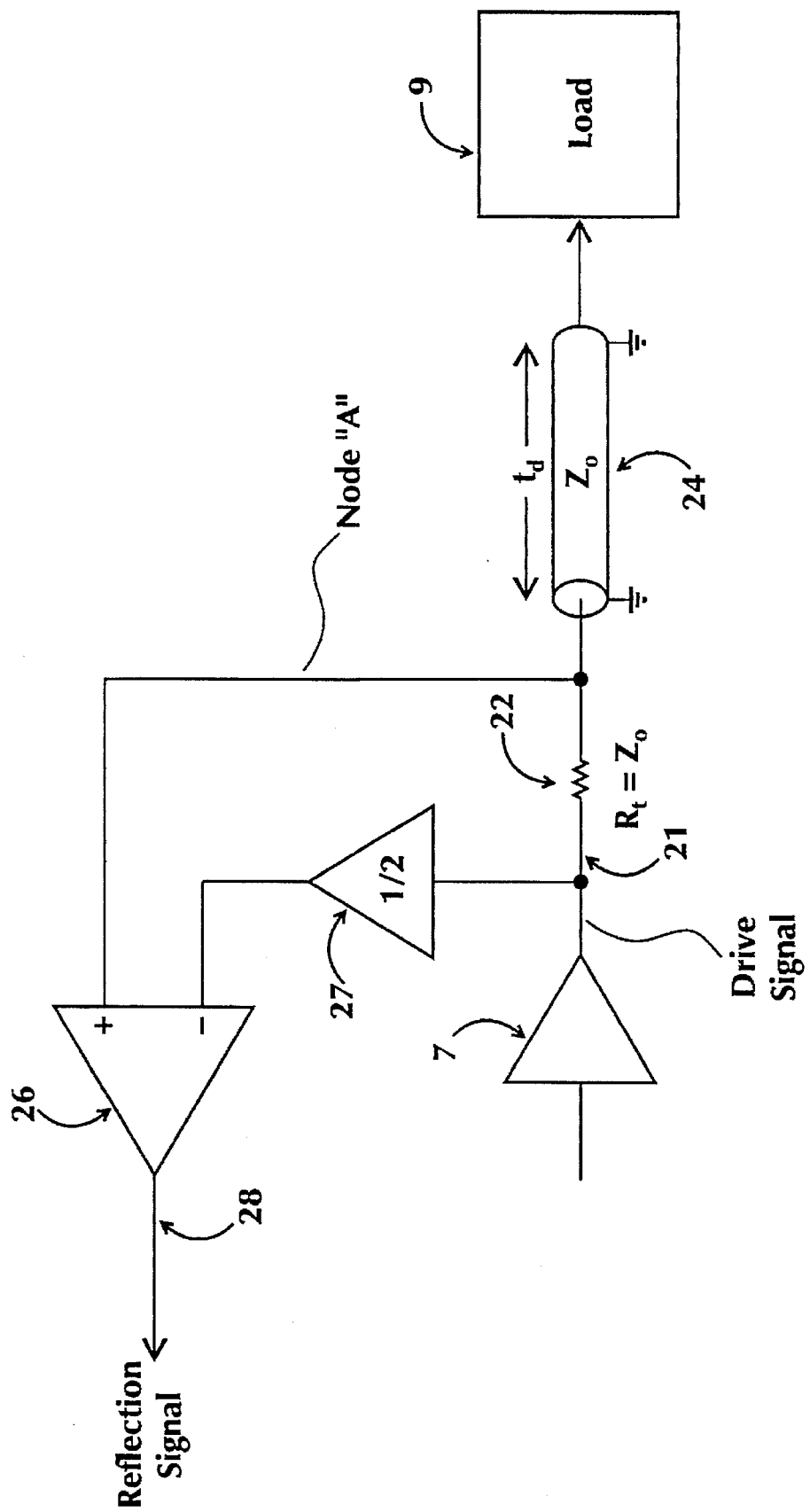
FIG. 3 illustrates a series terminated transmission line system of the present invention.

The present invention avoids the problems associated with the loss of area on the printed circuit board due to the use of parallel traces, excess power dissipation resulting from load termination and the use of a tapped transmission line, by using series termination and a single transmission line 24 both for driving the load and for sensing the round trip delay, as is illustrated in FIG. 3. Like reference numerals will be used for elements common to the prior art circuits of FIGS. 1 and 2. The drive signal 21 from the output buffer or driver 7 is applied to a single termination resistor 22, placed in series with the transmission line 24 and having a resistance which is equal to the impedance of the transmission line 24. The resistor 22 and the transmission line 24 form a voltage divider for signals applied from the driver 7. The junction of the resistor 22 and the transmission line 24 form a node A.

Figure 4:
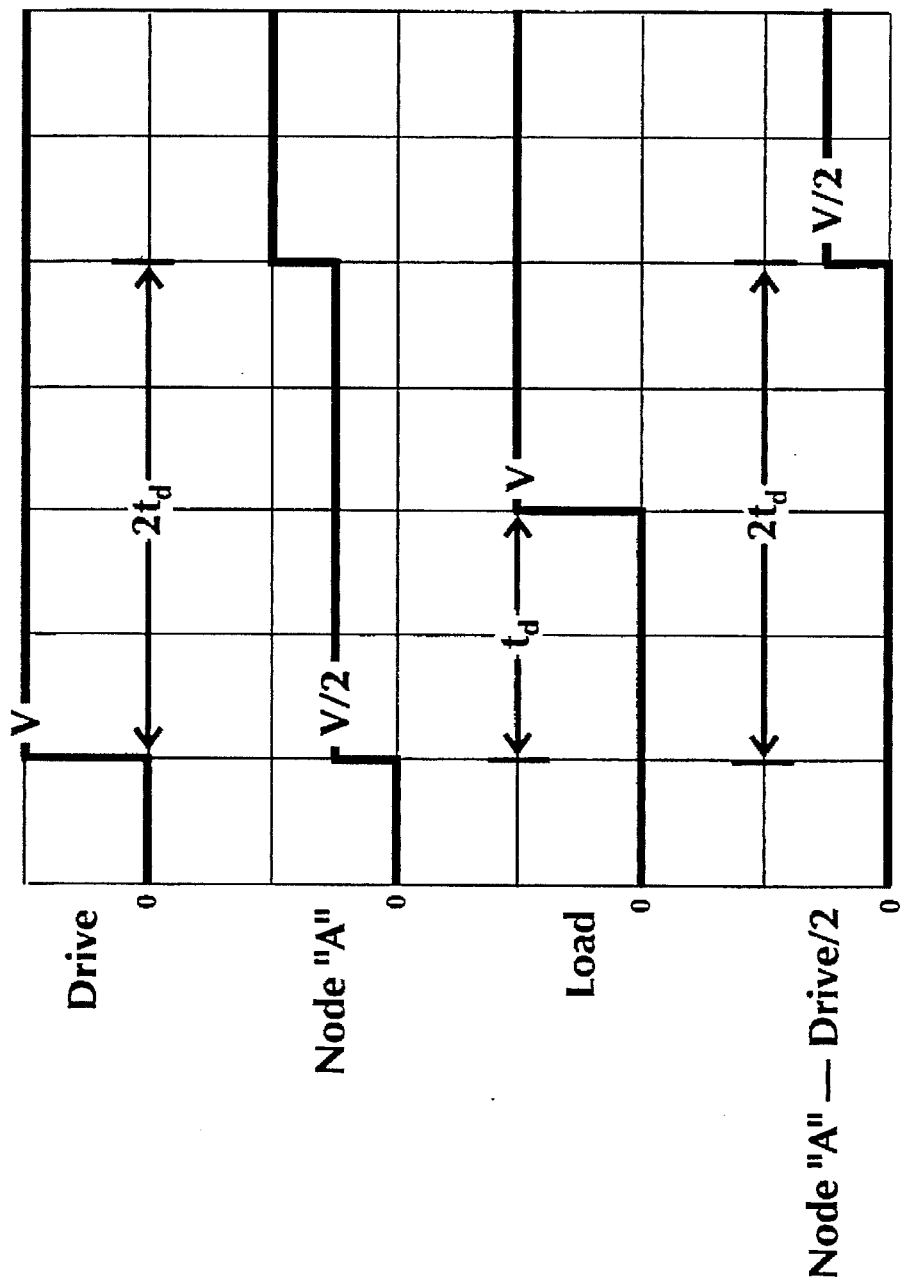
FIG. 4 illustrates the operation of the series terminated system of the present invention.

The operation of the resistor 22 and the transmission line 24 is illustrated in FIG. 4. If a step input of a voltage V is input from the driver 7, a voltage of V/2 will appear at the node A. After a time delay $t_d$, a voltage V/2 step will appear at the load 9. Because the load 9 is a high impedance compared to $Z_o$, the voltage V/2 step will be reflected by approximately one hundred percent (100%), causing the voltage at the load 9 to immediately go to the voltage level V. After another time delay $t_d$, the reflection will appear at the node A, causing its voltage to go to the voltage level V. Because the reflection sees the matched termination resistor 22 there are no further reflections.

The drive signal 21 is also applied to the divider 27 which divides voltages applied to it in half. The output of the divider 27 is then coupled as an input to a two input subtractor 26. Node A is also coupled to an input of the subtractor 26. The subtractor 26 then subtracts the output of the divider 27 from the voltage level at the node A and outputs the result as the reflection signal 28, which is input to the input buffer or the sense amp 8. The divider 27 and the subtractor 26 can be implemented in the circuit by any well known technique.

As described, if one half the drive signal 21 is subtracted from the signal at the node A by the subtractor 26, the result will be a voltage that is one half the level of the drive signal 21 and is delayed by the time delay $2t_d$. This is also illustrated in FIG. 4 for the step input described, but will also hold true for any arbitrary waveform. The output of the subtractor 26 is illustrated in FIG. 4 as the waveform A-Drive/2.

Using the knowledge that the voltage output from the subtractor 26 is one half the voltage of the drive signal 21 delayed by a time delay $2t_d$, the round trip delay can be determined and the deskewing circuitry adjusted as described above. In practice, this information is generated by using a high speed differential comparator, having good common mode rejection, with one input coupled to the node A and the other input coupled to the driver 7 through a voltage divider network having appropriate logic level biases.

Figure 1:
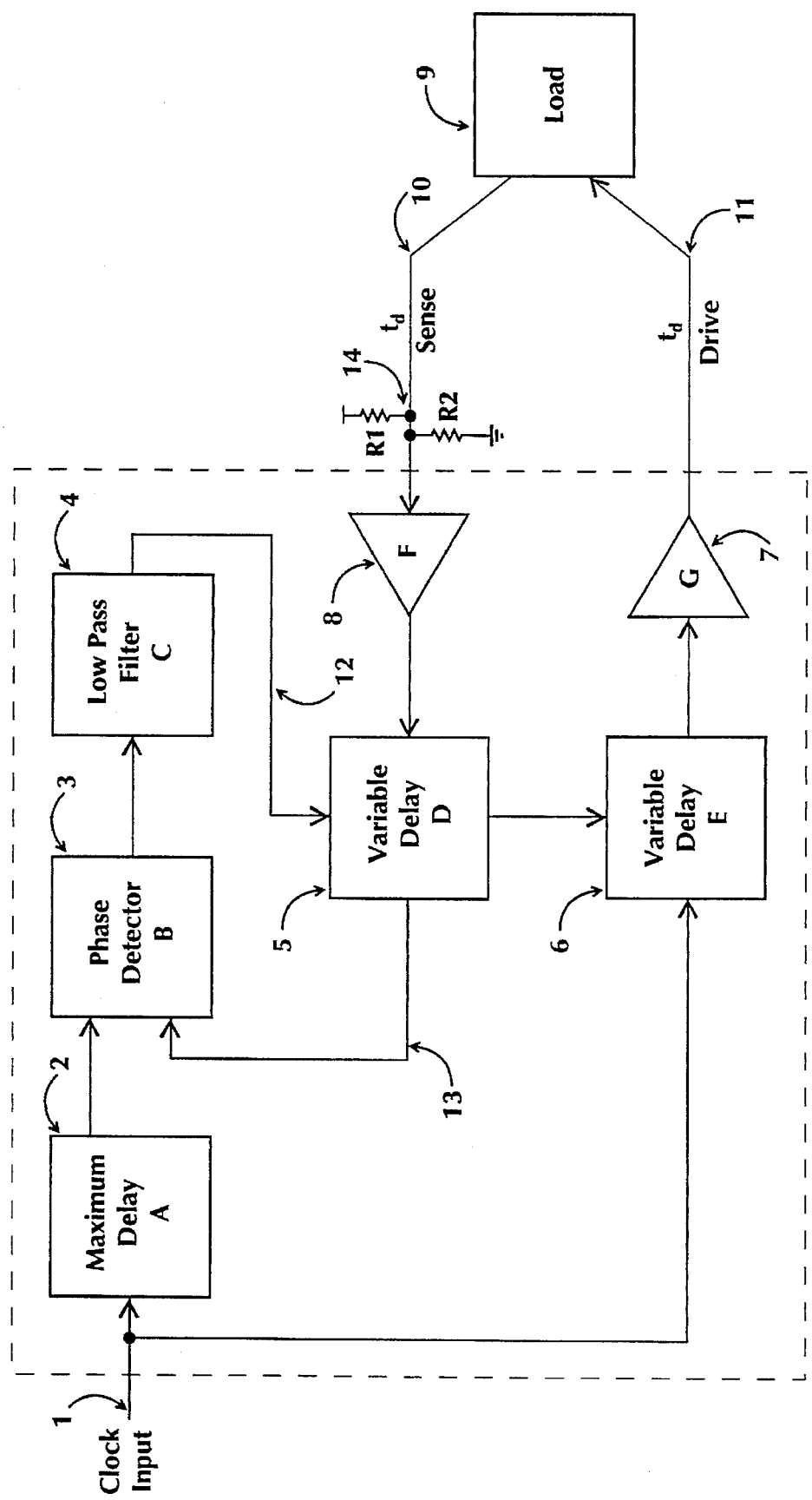
FIG. 1 illustrates a prior art clock driver deskew circuit utilizing a Thévenin terminated transmission line network.

The single transmission line series terminated system of the present invention can then replace the dual transmission line Thévenin terminated system as illustrated in FIG. 1 and be coupled to the deskew circuit shown within the dotted lines of FIG. 1. The Equation (4) will then also apply to a deskew circuit using the single line transmission system of the present invention, because the time delay $2t_d$ for the single line system is equal to the time delay $2t_d$ for the dual line system. Thus, if the same clock input signal 1 is applied to a number of identical deskew elements driving the loads 9 at different distances, with different transmission line delays, the clock edge will arrive at all loads driven by the different deskew elements simultaneously, assuming that the constant in Equation (4) is the same for all of the deskew elements in the circuit.

The single transmission line system of the present invention provides many advantages over the dual transmission line system. Only one transmission line is required in the single line system instead of the two transmission lines required by the dual line system. For printed circuit boards with multiple clock lines per board, using only one transmission line can represent a significant savings in board area. Also, in the single transmission line system only one termination resistor is required per clock line as opposed to the two resistor networks which are commonly used to achieve termination in the dual line system. In the single line system no static power is dissipated in the termination network and thus less power will be required for the system. Because of this the series termination resistors are more easily incorporated internally on an integrated circuit. Reflections from capacitive loads will be absorbed by the series termination system and will not be reflected back by the driver 7 as strongly as in the dual line system. There will be some reflection caused by the capacitance of the sense amp 8 input, but this is the same for both the single and parallel line systems.

Figure 5:
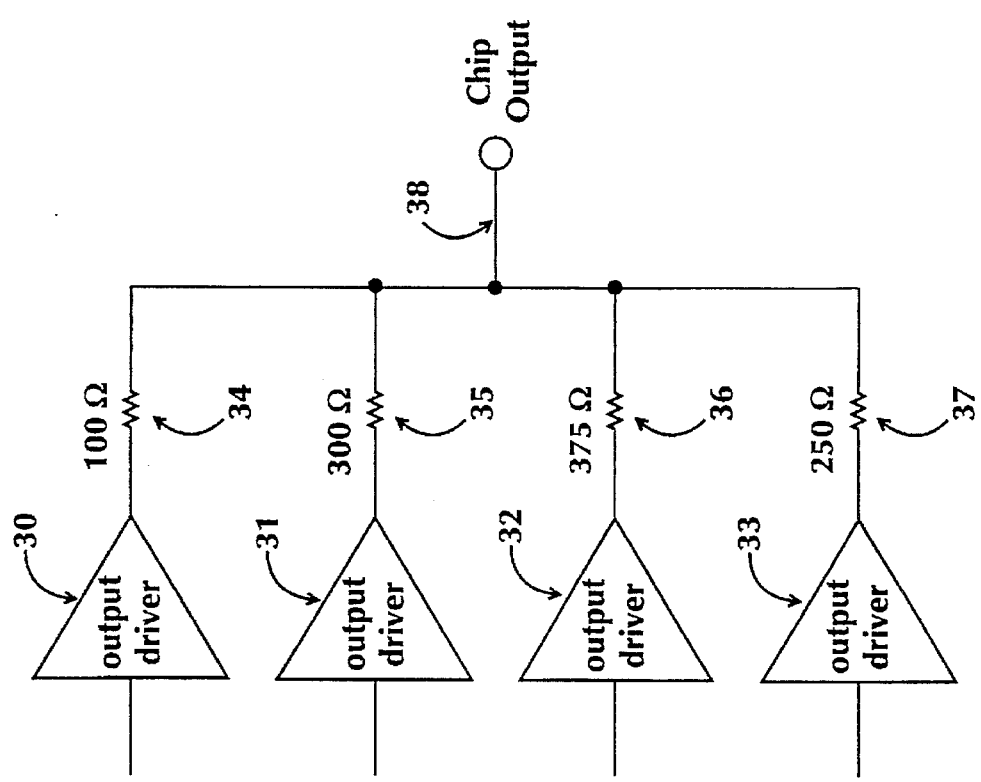
FIG. 5 illustrates an output driver impedance network to be used with the series terminated system of the present invention.

Different printed circuit board trace impedances of 50Ω, 62.5Ω, 75Ω and 100Ω are commonly used on printed circuit boards. To allow the board-level designer flexibility in choosing a line impedance for a particular application, the circuit as illustrated in FIG. 5 can be incorporated into the series clock deskewing apparatus of the present invention. The clock driver chip can include programmable output driver impedances using the circuit illustrated in FIG. 5 so that the line impedance of the transmission line can be matched. Each output driver 30, 31, 32 and 33 can be individually placed into a high-impedance state, so that any parallel combination of the output resistors 34, 35, 36 and 37 can be used to achieve the impedance of common transmission lines. Using just the first driver 30 with the first resistor 34 will obviously achieve a 100Ω termination impedance. The first two drivers 30 and 31 with the first two resistors 34 and 35 can be used to achieve a 75Ω termination impedance. The first three drivers 30, 31 and 32 with the first three resistors 34, 35 and 36 can be used to achieve a 62.5Ω termination impedance. Using all four output drivers 30, 31, 32 and 33 with all four resistors 34, 35, 36 and 37 will achieve a 50Ω termination impedance. The chip output 38 is then coupled to the transmission line 24 to form the node A.

It will be apparent to one of ordinary skill in the art that this variable impedance scheme could include any four resistor values to provide any four impedance matching values. Additionally, fewer or more parallel output drivers with resistors could be used to achieve fewer or more impedance matching values, where some or all of the output drivers can be individually placed into a high impedance state.

It will be apparent to one of ordinary skill in the art that various modifications may be made to the preferred embodiment without departing from the spirit and scope of the invention as defined by the appended claims. Specifically, while the clock deskewing apparatus of the preferred embodiment has been discussed and described in reference to printed circuit board (PCB) applications, the present invention is not intended to be so limited. It should be apparent to those skilled in the art that there are non-PCB applications in which the clock deskewing apparatus of the present invention may be used.

What is claimed is:

1. A series terminated clock deskewing apparatus for synchronously delivering a clock signal to a plurality of loads wherein the apparatus is coupled to each respective load via an appropriate one of a plurality of clock signal traces, one trace for each load, the apparatus comprising:

a. means in the apparatus for sending the clock signal to each respective load via its appropriate one of the traces and for receiving a reflection of the clock signal formed at the load and returned via the same trace;

b. means for determining an amount of elapsed time from a first time the clock signal was sent until a second time when the reflection was received, wherein the means for determining is coupled to receive the reflection; and c. means for introducing an appropriate first delay to the clock signal prior to applying the clock signal to an appropriate one of the traces, wherein the delay is based upon the amount of elapsed time.

2. The apparatus according to claim 1 further comprising a plurality of series impedances, each coupled between the apparatus and a corresponding one of the plurality of clock signal traces.

3. The apparatus as claimed in claim 2 wherein each of the plurality of series impedances is matched to an impedance of the corresponding one of the plurality of clock signal traces so that there is no secondary reflection.

4. The apparatus as claimed in claim 3 further comprising a maximum delay time such that there is a second delay for each load, wherein the second delay for each load is calculated by subtracting the amount of elapsed time of the trace from the maximum delay time wherein each load receives the clock signal simultaneously within a duration of the maximum delay time after the clock signal is sent by the apparatus.

5. The apparatus as claimed in claim 1 wherein the means for sending further comprises a programmable output driver impedance network coupled between the apparatus and each trace, the network comprising a plurality of output drivers and series impedances, when the output driver and impedances are selectively combined for matching an appropriate one of a plurality of transmission line impedances.

6. The apparatus as claimed in claim 5 wherein each programmable output driver impedance network comprises a first output driver coupled to a first series resistor, a second output driver coupled to a second series resistor, a third output driver coupled to a third series resistor and a fourth output driver coupled to a fourth series resistor.

7. The apparatus as claimed in claim 6 wherein the first resistor has a value of 100 ohms, the second resistor has a value of 300 ohms, the third resistor has a value of 375 ohms and the fourth resistor has a value of 250 ohms, for matching transmission line impedances of 100 ohms, 75 ohms, 62.5 ohms and 50 ohms.

8. A circuit comprising a plurality of series terminated clock deskewing apparatuses and a corresponding plurality of loads, wherein each load is coupled to one of the plurality of series terminated clock deskewing apparatuses for delivering a clock signal input to each of the corresponding plurality of loads and each of the series clock deskewing apparatuses delays the clock signal input a different amount of time so that the clock signal input is received by all loads simultaneously, each of the plurality of series terminated clock deskewing apparatuses comprising:
   a. means for delay coupled to the clock signal input and having a first time delay; and
   b. a variable delay loop coupled to the clock signal input and a load, the variable delay loop including:
      i. a first variable delay line coupled to the clock signal input and having a second time delay;
      ii. series means for transmitting the clock signal input to the load and for receiving a reflected signal representative of the clock signal input from the load, wherein the series means is coupled to the first variable delay line and the load and having a third time delay, wherein the third time delay is representative of a round trip delay;
      iii. a second variable delay line coupled to the series means for transmitting and having a fourth time delay; and
      iv. means for synchronizing and filtering the clock input signal coupled to the means for delay, the first variable delay line and the second variable delay line;
wherein the means for synchronizing and filtering matches the first time delay to the sum of the second, third, and fourth time delays by varying the second time delay and the fourth time delay.

9. The circuit as claimed in claim 8 wherein the third and fourth time delays are equal in value.

10. The circuit as claimed in claim 9 wherein the series means for transmitting comprises:
   a. an output driver coupled to the second variable delay line;
   b. a series resistor coupled to the output driver;
   c. a transmission line having an impedance coupled to the load and the series resistor, the value of the series resistor equal to the impedance of the transmission line;
   d. a divider coupled to the output driver and the series resistor;
   e. a subtractor coupled to the series resistor, the transmission line and the divider; and
   f. a sense amp coupled to the subtractor.

11. The circuit as claimed in claim 10 wherein the means for synchronizing is comprised of a phase detector coupled to the first variable delay line and the second variable delay line and a low-pass filter coupled to the phase detector and also coupled for controlling the second variable delay line.

12. The circuit as claimed in claim 11 wherein the output driver and the series resistor are replaced by a programmable output driver impedance network comprising a plurality of output drivers each coupled to a series resistor for matching the impedance of the transmission line wherein the transmission line has one of a plurality of impedance values.

13. The circuit as claimed in claim 12 wherein the programmable output driver impedance network comprises a first output driver coupled to a first series resistor, a second output driver coupled to a second series resistor, a third output driver coupled to a third series resistor and a fourth output driver coupled to a fourth series resistor.

14. The circuit as claimed in claim 13 wherein the first resistor has a value of 100 ohms, the second resistor has a value of 300 ohms, the third resistor has a value of 375 ohms and the fourth resistor has a value of 250 ohms, for matching transmission line impedances of 100 ohms, 75 ohms, 62.5 ohms and 50 ohms.

15. A series terminated clock deskewing apparatus for delivering a clock signal input to a load, comprising:
   a. a maximum delay line having an input and an output, the input of the maximum delay line coupled to the clock signal input;
   b. a first variable delay line having an input and an output, the input of the first variable delay line coupled to the clock signal input;
   c. an output driver having an input and an output, the input of the output driver coupled to the output of the first variable delay line;
   d. a series resistor having a first terminal and a second terminal, the first terminal of the series resistor coupled to the output of the output driver;
   e. a transmission line having a characteristic impedance coupled between the second terminal of the series resistor and a load;
   f. a divider having an input and an output, the input of the divider coupled to the output of the output buffer and the first terminal of the series resistor;
   g. a subtractor having a first input, a second input and an output, the first input of the subtractor coupled to the second terminal of the series resistor and the transmission line, the second input of the subtractor coupled to the output of the divider, the subtractor for outputting the difference between a value at the second terminal of the series resistance and a value at the output of the divider;
   h. an input buffer having an input and an output, the input of the input buffer coupled to the output of the subtractor;
   i. a second variable delay line having an input and an output, the input of the second variable delay line coupled to the output of the input buffer;

j. a phase detector having a first input, a second input and an output, the first input of the phase detector coupled to the output of the maximum delay line and the second input of the phase detector coupled to the output of the second variable delay line, the phase detector for synchronizing the output of the maximum delay line and the output of the second variable delay line; and k. a low-pass filter having an input and an output, the input of the low-pass filter coupled to the output of the phase detector, the output of the low-pass filter coupled to control the operation of the first variable delay line and the second variable delay line, the low-pass filter for smoothing the output of the phase detector.

16. The series clock deskewing apparatus as claimed in claim 15 wherein the output driver and the series resistor are replaced by a programmable output driver impedance network comprising a plurality of output drivers each coupled to a series resistor for matching one of a plurality of impedances of said transmission line.

17. The series clock deskewing apparatus as claimed in claim 16 wherein the programmable output driver impedance network comprises a first output driver coupled to a first series resistor, a second output driver coupled to a second series resistor, a third output driver coupled to a third series resistor and a fourth output driver coupled to a fourth series resistor.

18. The series clock deskewing apparatus as claimed in claim 17 wherein the first resistor has a value of 100 ohms, the second resistor has a value of 300 ohms, the third resistor has a value of 375 ohms and the fourth resistor has a value of 250 ohms, for matching transmission line impedances of 100 ohms, 75 ohms, 62.5 ohms and 50 ohms.

19. A circuit comprising a plurality of series terminated clock deskewing apparatuses and a corresponding plurality of loads, wherein each load is coupled to one of the plurality of series terminated clock deskewing apparatuses for delivering a clock signal input to a corresponding each of the plurality of loads and each of the series clock deskewing apparatuses delays the clock signal input an appropriate amount of time so that the clock signal input is received by all loads simultaneously, each of the plurality of series terminated clock deskewing apparatuses comprising:

a means for delay coupled to the clock signal input and having a first time delay; and b. a variable delay loop coupled to the clock signal input and to a corresponding one of the plurality of loads, the variable delay loop including:

i. a first variable delay line coupled to the clock signal input and having a second time delay;

ii. series means for transmitting a signal representative of the clock signal to the load and for receiving a reflected signal from the load, wherein the series means is coupled to the first variable delay line and to the corresponding load and has a third time delay representative of a round trip delay time from when the signal representative of the clock signal is transmitted and when the reflected signal is received;

iii. a second variable delay line coupled to the series means for transmitting and having a fourth time delay; and iv. means for ensuring that each of the loads receives the corresponding signal representative of the clock signal at substantially the same time, wherein the means for ensuring is coupled to control the second and fourth time delay.

* * * * *